United States Patent
Yoshida et al.

(10) Patent No.: US 6,590,479 B2
(45) Date of Patent: Jul. 8, 2003

(54) INTEGRATED MICROCONTACT PIN AND METHOD FOR MANUFACTURING THE SAME

(75) Inventors: Haruo Yoshida, Tokyo (JP); Yasuhiro Maeda, Tokyo (JP); Yoshihide Miyagawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/877,953

(22) Filed: Jun. 8, 2001

(65) Prior Publication Data

US 2001/0054510 A1 Dec. 27, 2001

(30) Foreign Application Priority Data

Jun. 15, 2000 (JP) ........................................ 2000/179423

(51) Int. Cl.[7] .................................................. H01P 1/04
(52) U.S. Cl. ........................ 333/260; 174/262; 439/578
(58) Field of Search ........................... 439/578; 174/260, 174/261, 262; 356/419; 333/260

(56) References Cited

U.S. PATENT DOCUMENTS

| | | | | |
|---|---|---|---|---|
| 4,083,052 A | * | 4/1978 | Metcalf | ...................... 324/171 |
| 4,153,988 A | * | 5/1979 | Doo | ............................. 29/827 |
| 6,028,497 A | * | 2/2000 | Allen et al. | .................. 257/698 |

\* cited by examiner

*Primary Examiner*—Robert Pascal
*Assistant Examiner*—Stephen E. Jones
(74) *Attorney, Agent, or Firm*—David N. Lathrop, Esq.; Gallagher & Lathrop (57) ABSTRACT

The invention allows for testing by high velocity signals of high density LSIs prior to being packaged having an electrode spacing on the odder of 150 μm, for example. Coaxial transmission lines 13 for termination formed through a terminal support 11 are arranged in a two-dimensional array. Connected to one ends of the transmission lines 13 are one ends of contact pins 18 such as conductive whiskers while the other ends of the transmission lines 13 are connected to a transmission line block 61 of a three-dimensionally upwardly gradually broadening configuration through a connection plate 72 similar in construction to the terminal support 11. The transmission line block 61 holds high frequency transmission lines 62 for relay connected at one ends to the other ends of the coaxial transmission lines 13 and having spacings between the adjacent lines broadened at the other upper ends. The widely spaced upper ends of the transmission lines 62 are connected to a performance board (not shown). The contact pins 18 are about 0.3 to 0.5 mm in length and the characteristics impedance is maintained uniform over all the transmission lines 62. The terminal support 11 is replaceable.

10 Claims, 11 Drawing Sheets

INTEGRATED MICROCONTACT PIN AND METHOD FOR MANUFACTURING THE SAME

BACKGROUND OF THE INVENTION

This invention relates to a microcontact pin device having micro contact pins integrated therein for use to test the operation of semiconductor integrated circuits prior to being packaged and packaged microminiature semiconductor integrated circuits, for example, and a method for manufacturing such microcontact pin device.

The conventional microcontact pin device which is designed to contact with a semiconductor integrated circuit for checking the operation of the semiconductor integrated circuit prior to being packaged has resembled a needle tip and been adapted for probing low velocity signals. Consequently, the conventional microcontact pin device of this type has been provided with no special consideration such as making the characteristic impedance uniform through the signal transmission lines.

This has led to troubles such as reflection and crosstalk when such microcontact pin device is used to transmit and receive high velocity signals to and from a semiconductor integrated circuit.

An example of the commercially available microcontact pin device having incorporated therein the concept of a signal transmission line designed for probing high velocity signals is the microwave prober sold by the Cascade Microwave Inc. It comprises a frame to which a first block carrying input microcontact pins and a second block carrying output microcontact pins are mounted and is designed for probing a pair of points on a semiconductor integrated circuit. However, this microwave prober requires a long time to test many spots on the semiconductor integrated circuit and is not capable of simultaneously testing the operations of a plurality of spots.

In the past, the multiple channel probing pin device for simultaneously probing many spots is known as per the Japanese Patent Laid Open Application No. 321170195 entitled "Probe Assembly for Testing IC Circuit" (U.S. patent application Ser. No. 08/247,874). This probe assembly comprises a layer of dielectric film having a resilient thin metal sheet formed on one side thereof and a multiplicity of metallic lead patterns formed in juxtaposition on the other side thereof, one end of each of the lead patterns on the same side thereof projecting about 0.76 mm beyond the adjacent side of the dielectric film layer to define a probe tip (contact pin). Although not specifically described, it is considered from the statement "providing a proper electrical impedance characteristic to the ground" that the metal sheet and the multiplicity of metallic lead patterns may constitute microstrip transmission lines, respectively, so that it is presumed that it may be possible to make many pins simultaneously probe over a semiconductor integrated circuit with the characteristics of the high frequency transmission lines maintained.

However, with such integrated microcontact pin device, due to the fine pin pitch and the contact pins being extremely thin, the contact pins are likely to wear out relatively fast and yet unevenly over the individual pins from repeated use, so that it is required to replace the whole sheet on which the multiplicity of lead patterns including the contact pins are formed. In such event, since in the conventional integrated microcontact pin device as disclosed in the aforesaid Japanese Patent Laid Open Application, the sheet including the lead patterns is relatively large and relatively expensive, replacement of such expensive sheet will involve a considerably high cost.

In addition, the aforesaid integrated microcontact pin device is attended with the problem of occurrence of interference between the decodings of signals transmitted through adjacent lead patterns, that is, interference between the channels, because the lead patterns are close to each other with no barrier interposed therebetween.

Moreover, the contact pins are arrayed in one or two rows and arranged to probe the pads disposed along each side of the rectangular semiconductor integrated circuit.

It has been found that the integrated microcontact pin device for conducting a test on a packaged microminiature semiconductor integrated circuit is likewise attended with the problems similar to those discussed above.

Accordingly, an object of this invention is to provide a microcontact pin device which may be made inexpensively even if it has a fine pin pitch on the odder of 150 $\mu$m, for example, and has a large number of pins, and a method for manufacturing such microcontact pin device.

Another object of this invention is to provide a microcontact pin device which may be replaced easily and yet at a relatively low cost with another one, and a method for manufacturing such microcontact pin device.

DISCLOSURE OF THE INVENTION

In the integrated microcontact pin device according to this invention, a terminal support has a plurality of high frequency transmission lines for termination (which will be referred to as "termination high frequency transmission line" hereinafter) capable of transmitting direct current formed therethrough. Contact pins are connected at one ends to one ends of the corresponding termination high frequency transmission lines on one side surface of the terminal support.

According to another embodiment of this invention, a transmission line block is detachably attached to the terminal support on the other side surface of the support. The transmission line block has a plurality of high frequency transmission lines for relay (which will be referred to as "relay high frequency transmission line" hereinafter) arranged in an array. One ends of the relay high frequency transmission lines are arrayed at the same spacings between the termination high frequency transmission lines and are connected to the other ends of the corresponding termination high frequency transmission lines. The spacings between the relay high frequency transmission lines at their other ends are broadened to be larger than the spacings between the termination high frequency transmission lines.

According to still another embodiment of this invention, the terminal support is in the form of a plate, the termination high frequency transmission lines are two-dimensionally distributed, and the transmission line block is of a three-dimensionally gradually broadening configuration.

According to yet another embodiment of this invention, the relay high frequency transmission lines are shielded from each other in terms of high frequency.

According to yet another embodiment of this invention, the termination high frequency transmission lines are shielded from each other in terms of high frequency.

In another aspect, this invention provides a method for manufacturing an integrated microcontact pin device comprising:

preparing a terminal support having termination high frequency transmission lines capable of transmitting direct current formed therethrough;

arranging microcontact pins on a thin substrate and stacking a plurality of the substrates one on another in an oblique manner to form a build-up substrate assembly, each of the substrates having the microcontact pins arranged thereon;

connecting one ends of the microcontact pins of the build-up substrate assembly to one ends of the corresponding termination high frequency transmission lines; and dissolving and removing the substrates of the build-up substrate assembly.

BRIEF DESCRIPTION OF THE DRAWINGS

FIG. 1 illustrates one embodiment of this invention, with

DETAILED DESCRIPTION OF THE PREFERRED EMBODIMENTS

FIG. 1 illustrates one embodiment of the integrated microcontact pin device according to this invention.

Figure 1A:
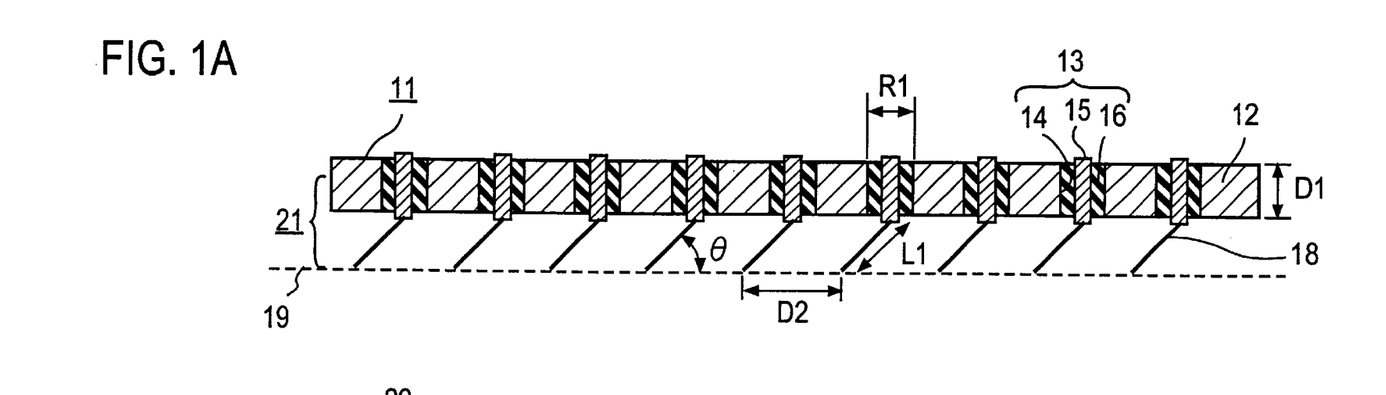
FIG. 1A being a cross-sectional view taken on line 1A—1A of FIG. 1B.
Figure 1B:
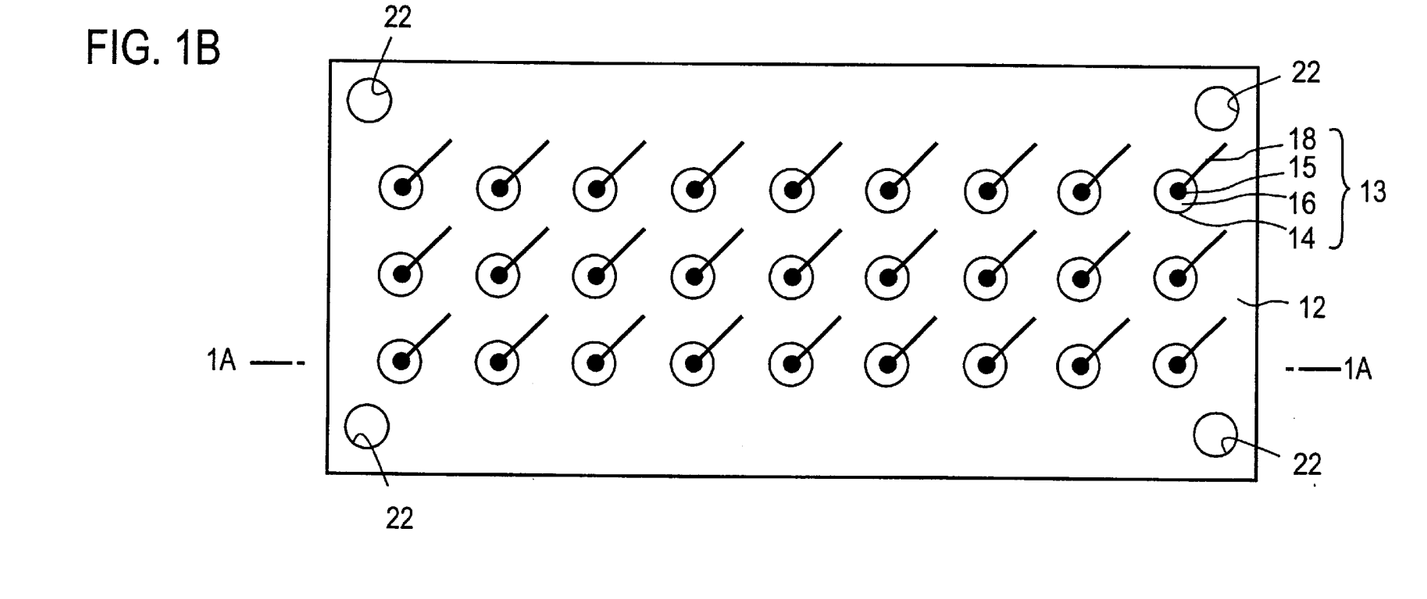
FIG. 1B being a bottom view of FIG. 1A.

The terminal support 11 in this example comprises a rectangular substrate 12 having a plurality of high frequency transmission lines 13 for termination formed therethrough and arrayed in the form of a matrix. Each of the high frequency transmission lines 13 for termination is designed to pass direct current therethrough. In the example illustrated, the termination high frequency transmission line 13 is configured as a coaxial transmission line, and the substrate 12 is made of an electrically conductive material such as metal. The substrate 12 has through-bores 14 formed therethrough, in each of which a central conductor 15 is received along the central axis of the through-bore 14. A gap between the central conductor 15 and the inner peripheral surface of the through-bore 14 is filled with a dielectric layer 16 to complete a coaxial transmission line 13 having the conductive substrate 12 function as an outer conductor.

On one side surface of the terminal support 11, contact pins 18 are each connected at one end to the corresponding one of the termination high frequency transmission lines 13 to pass direct current. In this example, the one ends of the contact pins 18 are connected to one ends of the corresponding central conductors 15. It is preferable that the contact pin 18 extend obliquely with respect to the central conductor 15. Specifically, the angle θ of the contact pin 18 relative to the horizontal plane 19 may preferably be 30° to 60° when the central conductor 15 is oriented to extend perpendicularly to the horizontal plane 19.

The substrate 12 is formed at appropriate positions such as four corners as shown with locating holes 22 for mounting to a performance board, for example for connection with a testing apparatus.

The number of termination high frequency transmission lines 13 may be practically large such as on the order of several 10's to several 100's× several 10's to several 100's. The substrate 12 may have a thickness D1 of 300 μm, the spacings (pitch) D2 of the contact pins 18 may be about 150 μm, the inner diameter of the through-bore 14 may be 80 μm, and the contact pin 18 may be 30 to 50 μm in length L1.

The characteristic impedance of the termination high frequency transmission lines 13 may be 50 Ω, for example such that it matches with the characteristic impedance of the connection line to a semiconductor integrated circuit testing apparatus to which the transmission lines 13 are to be connected. For the coaxial transmission line, the characteristic impedance depends on the inner diameter of the outer conductor, the outer diameter of the central conductor and the permitivity of the dielectric between them.

Alternatively, an electrically insulating material such as ceramics may be used to form the substrate 12 and the inner peripheral surfaces of the through-bores 14 may be metallized by vapor depositing metal thereon to thereby form outer conductors for coaxial transmission lines.

Embodiments of the method for manufacturing the microcontact pin device will now be described with reference to FIG. 2.

Figures 2A, 2B, 2C:
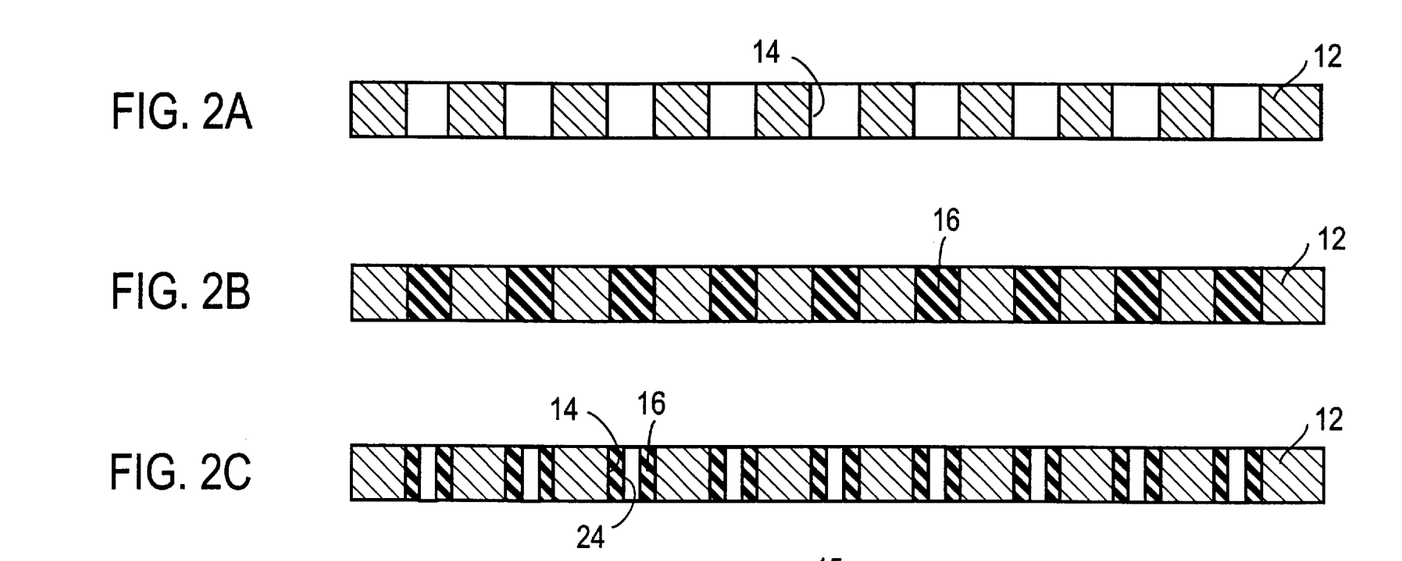
FIGS. 2A–2E are cross-sectional views corresponding to FIG. 1A and illustrate the steps of the method for manufacturing the terminal support 11 in FIG. 1.
Figures 2D, 2E:
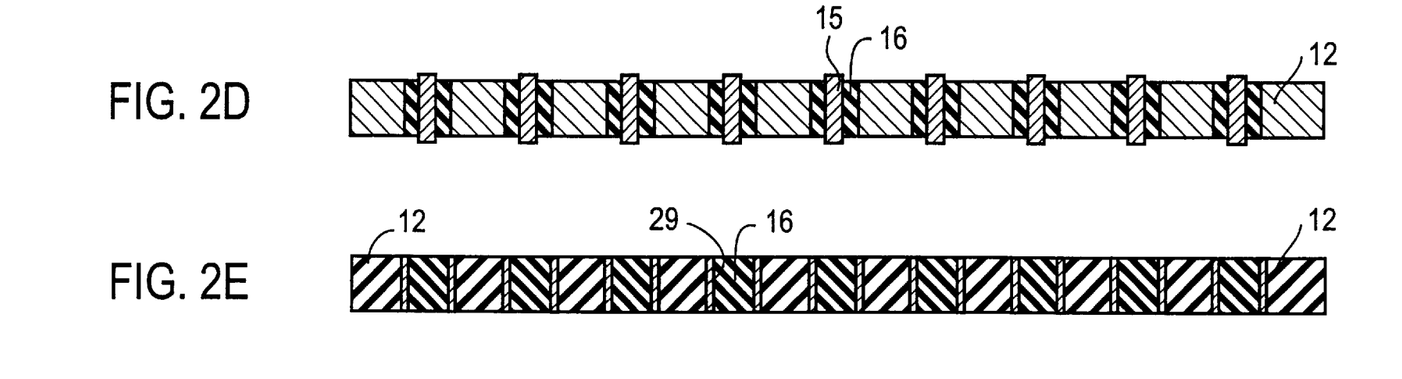

The substrate 12 may be made of metallic material such as Al, Cu, bronze or the like or a conductive material composed of a silicon base plate injected with impurities such as boron, and be formed with circular through-bores 14 as by photoetching process at locations where termination high frequency transmission lines 13 are to be formed, as shown in FIG. 2A. It is to be noted that the cross-sections in FIG. 2 correspond to that in FIG. 1A. During this step, although not shown in FIG. 2, the locating holes 22 as seen in FIG. 1B may be concurrently formed through the substrate.

The next step, as shown in FIG. 2B, is to fill the through-bores 14 with layers 16 of dielectric such as $SiO_2$, for example by CVD (chemical vapor deposition) process, followed by forming central apertures 24 through the dielectric layers concentric with the through-bores 14 as by photoetching process, as shown in FIG. 2C. Then, the central apertures 24 are filled with central conductors 15 by plating or vapor depositing with gold or copper, as shown in FIG. 2D. Alternatively, embedding central conductors 15 into the central apertures 24 may be effected by inserting metallic filaments into the apertures and hermetically sealing them with glass. It is thus to be appreciated that the terminal support 11 in FIG. 1 may be constructed.

Figure 3A:
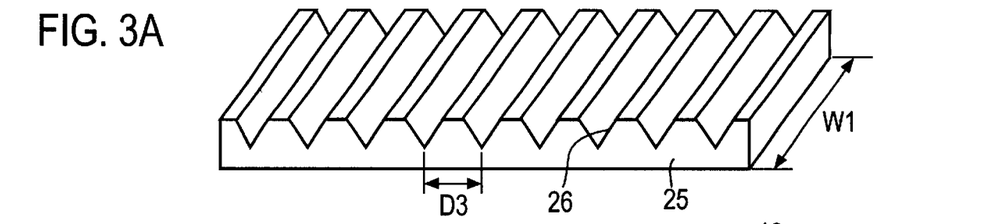
FIGS. 3A–3F are illustrations showing the steps of bonding the aggregate of contact pins 18 to the terminal support 11 in FIG. 1.

An aggregate of contact pins may be made as follows: As shown in FIG. 3A, a thin substrate 25 is formed with a plurality of equally spaced parallel positioning grooves 26. The pitch D3 of the positioning grooves 26 is made equal to the pitch D2 of the contact pins 18. The width W1 of the substrate 25 is approximately equal to the length L1 of the contact pins 18. The positioning grooves 26 are preferably V-shaped grooves and may be easily formed by using a silicon crystal board for the substrate 25 and utilizing a patterning method and the anisotropy of the silicon crystal.

Figure 3B:
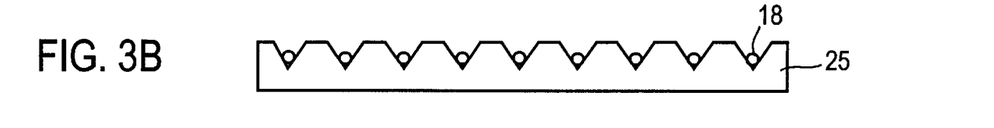
Figure 3C:
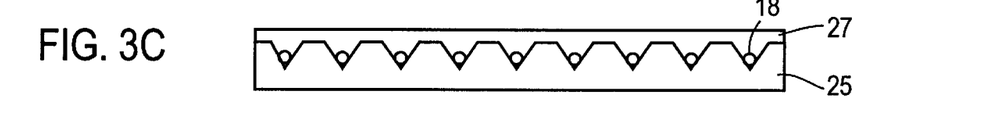

Then, as shown in FIG. 3B, a contact pin 18 is inserted in each of the positioning grooves 26 as guided therealong. For the contact pin 18, it is possible to use conductive whiskers (whisker-like single crystals), gold-plated filamentous glass, resilient metallic filaments such as phosphor bronze wire, or any other suitable material of about 20 to 30 $\mu$m in diameter which is electrically conductive as well as hard and yet resilient. In order to hold the contact pins 18 positioned in the positioning grooves 26 in place, a thin retaining film 27 of electrically insulating material such as $SiO_2$ may be formed on the substrate 25 as by CVD process, as shown in FIG. 3C. The contact pins 18 are thus retained in place as they are embedded between the substrate 25 and the retaining film 27.

Figure 3D:
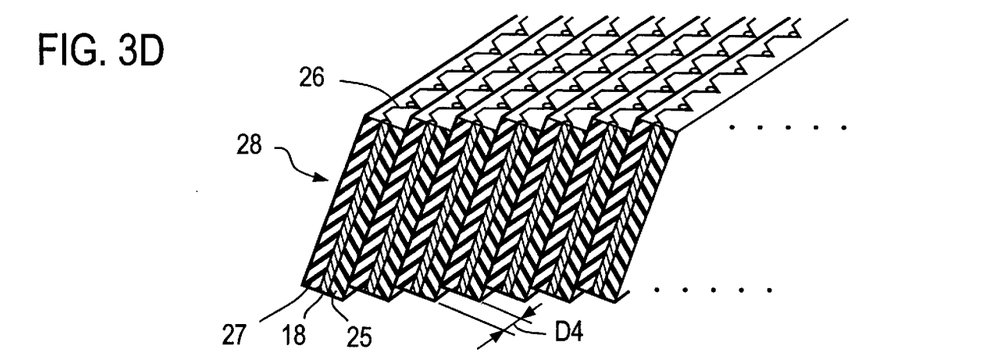

A plurality of the substrates 25 having thus a plurality of contact pins 18 retained thereon are stacked on one another such that they are successively staggered by a distance D4 longitudinally of the contact pins 18 and are bonded together with adhesives such as epoxy-based organic adhesive or polyimide-based organic adhesive interposed between the adjacent boards to form a built-up assembly 28, as shown in FIG. 3D. The displacement distance D4 is determined such that when the built-up assembly is oriented horizontally, the angle $\theta$ formed by the contact pins 18 with respect to the horizontal plane defines a predetermined value (30 to 60°).

Figure 3E:
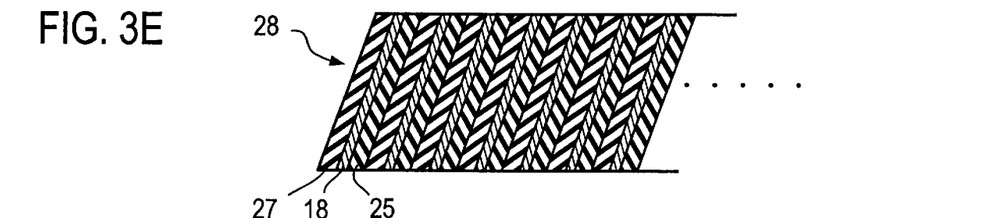

The next step is to flatten the upper and lower surfaces of the built-up assembly 28 as by machining so as to expose the opposite ends of the contact pins 18 as contact faces lying in the same plane, as shown in FIG. 3E. In this regard, the pitch of the positioning grooves 26, the thickness of the substrates 25, the depth of the grooves 26 and the thickness of the retaining films 27 are pre-selected such that the pitches in the column direction and the row direction of the contact pins 18 arrayed in a matrix coincide with the pitches in the column direction and the row direction, respectively of the central conductors 15 of the coaxial transmission lines 13 supported in the terminal support 11.

Figure 3F:
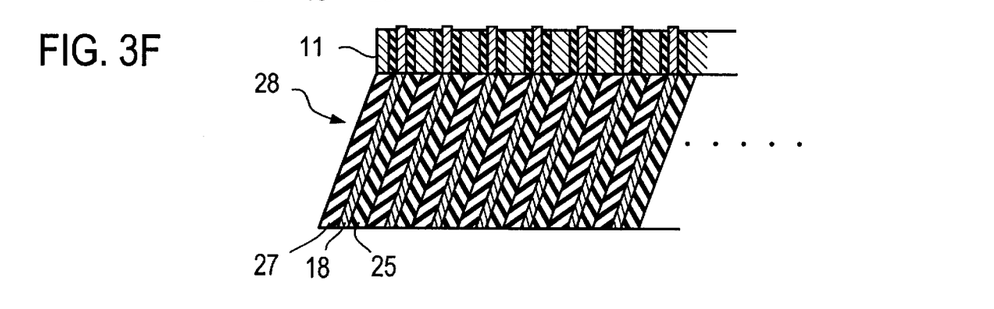

Then, the built-up assembly 28 (FIG. 3E) having its upper and lower surfaces flattened and the terminal support 11 (FIG. 2D) are bonded together as by heat welding or soldering with the end faces of the contact pins 18 and the associated end faces of the central conductors 15 in abutment with each other, as shown in FIG. 3F. Subsequently, the substrates 25 and the retaining films 27 are chemically dissolved and removed. In this regard, the central conductors 15 may be formed of a material such as conductor plated with gold which is insusceptible to chemical reaction, and the substrates 25 and the retaining films 27 are removed separately as by chemical etching by using chemical resolvents which are capable of dissolving them separately. If required, the terminal support 11 may be masked with resist material which will protect the support against chemical attack prior to dissolving away the substrates 25 and the retaining films 27. It is to be understood that the integrated microcontact pin device as shown in FIG. 1 is obtained through this process. Preferably, the end faces of the central conductors 15 are projected slightly beyond the plane of the terminal support 11 (substrate 12) in order to facilitate and insure positive bonding between the central conductors 15 and the contact pin 18.

While conductive material is employed for the substrate 12 of the terminal support 11 in the embodiment described above, an electrically insulating material such as ceramics may be used to form the substrate 12. In that case, subsequently to forming the through-bores 14 as shown in FIG. 2A, the inner peripheral surfaces of the through-bores 14 may be metallized by vapor depositing gold or the like thereon to form outer conductors 29 as shown in FIG. 2E, followed by forming the central conductors 15 and dielectric layers 16 within the outer conductors 29 by the procedures similar to those described hereinbefore with reference to FIGS. 2B–2D.

Figure 4:
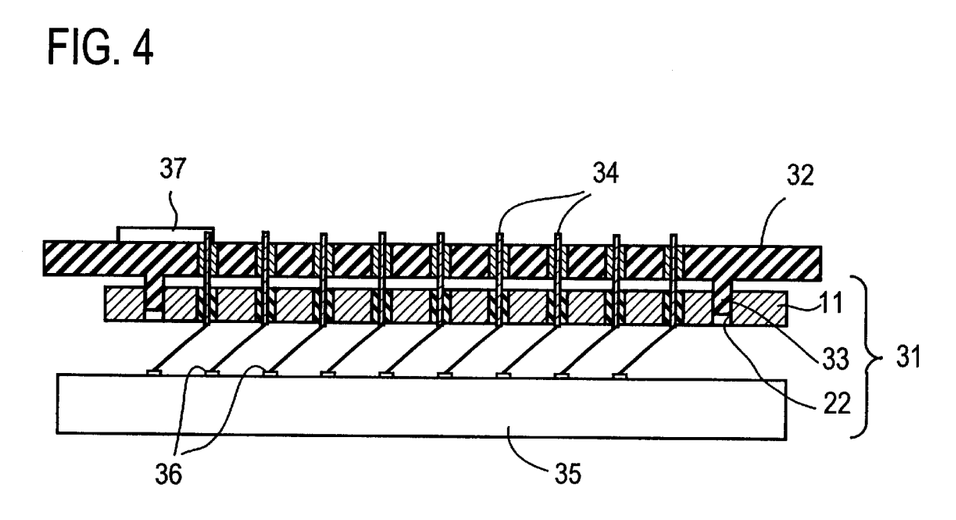
FIG. 4 is a cross-sectional view illustrating the manner in which the embodiment of this invention is in use.

As shown in FIG. 4, with locating pins 33 projecting from a signal processing performance board 32 of a semiconductor integrated circuit testing apparatus fitted into the corresponding locating holes 22 in the terminal support 11 and with the coaxial transmission lines 13 (termination high frequency transmission lines) connected with coaxial type through-holes 34 in the performance board 32, the integrated microcontact pin device 31 according to this invention is removably secured to the performance board 32. Testing is conducted with the outer ends of the contact pins 18 of the integrated microcontact pin device 31 in contact with the corresponding pads (electrodes) 36 on a semiconductor integrated circuit 35 to be tested. It should be noted here that the pads (electrodes) 36 include electrodes for applying DC bias, electrodes for applying test signals (transmitting), and probing (receiving) electrodes. The arrangement is such that the coaxial type through-holes 34 of the performance board 32 and the termination high frequency transmission line 13 match with each other in their characteristic impedances. This, in combination with the contact pins 18 having a very short length of about 0.3 to 0.5 mm, provides for satisfactorily transmitting high velocity testing signals to the pads 36 and satisfactorily transmitting high velocity signals from the pads 36 back to the performance board 32. That one of the coaxial type through-holes 34 which is connected with that one of the contact pins 18 which is to have bias applied is connected to a transmission line pattern 37 on the performance board 32.

Figure 5A:
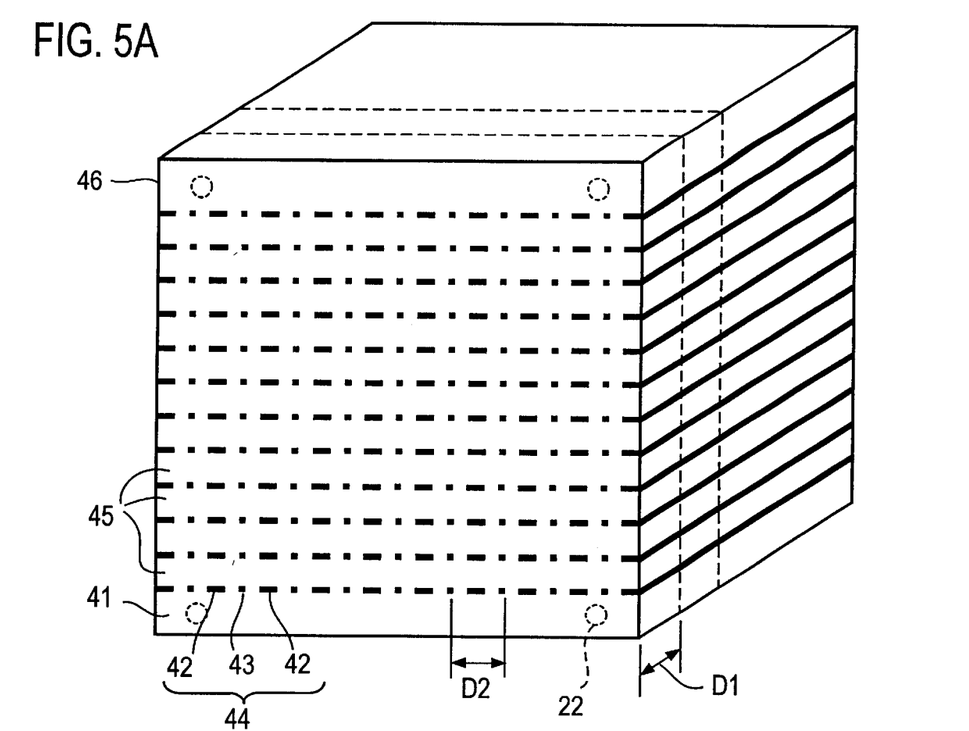
FIGS. 5A–5C are illustrations showing the steps of making a terminal support 11 having coplanar transmission lines.

While coaxial type transmission lines are employed for the termination high frequency transmission lines in the embodiment described above, it should be understood that any other type of transmission line which is capable of transmitting high frequency signals as well as DC signals may be used. By way of example, coplanar transmission lines may be employed. In that instance, as shown in FIG. 5A, wide ground leads 42 and narrow signal leads 43 are alternately formed on a dielectric substrate 41 such as $Si_3N_4$ substrate, ceramic substrate or glass substrate as by patterning onto copper foil or gold foil, for example such that each one of the signal leads 43 and two ground leads 42 adjacent thereto on its opposite sides cooperate to form a coplanar transmission line 44. Then, a dielectric layer 45 is formed on these multiple parallel coplanar transmission lines 44 by depositing $SiO_2$ thereon by chemical vapor deposition or vapor deposition process, for example, and on that dielectric layer 45, coplanar transmission lines 44 are similarly formed. The steps of forming alternately coplanar transmission lines 44 and dielectric layers 45 are repeated until a desired build-up assembly of coplanar transmission lines and dielectric layers is obtained. The arrangement is such that the pitches and numbers of the transmission lines 44 as viewed both horizontally and vertically in the drawing will coincide with the pitches and numbers of the desired array of contact pin 18.

Subsequently, this build-up assembly of transmission lines may be cut in thicknesses D1 corresponding to the thickness of the desired terminal support 11 transversely of the length of the coplanar transmission lines 44, as shown in broken lines in FIG. 5A to obtain a plurality of terminal supports 11 having coplanar transmission lines 44 as termination high frequency transmission lines 13.

Figure 5B:
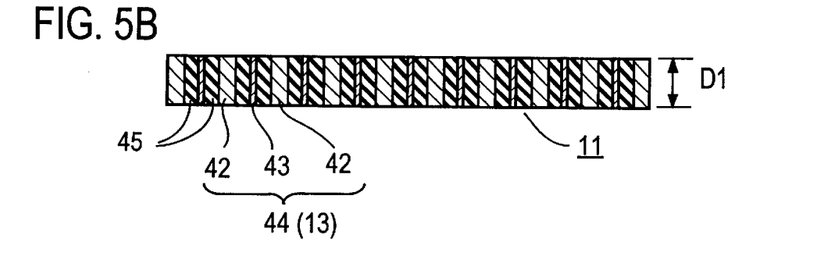
Figure 5C:
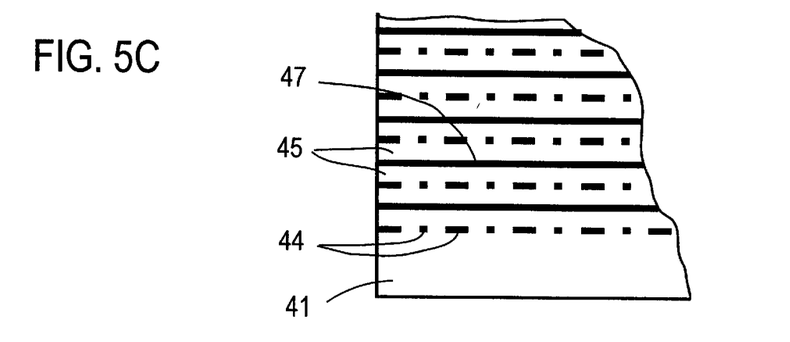

FIG. 5B is a cross-sectional view corresponding to FIG. 1A but illustrating the terminal support 11 having termination coplanar transmission lines. Relatively thick substrates 41 and 46 are formed on the lower and upper portions of the build-up assembly, respectively as viewed in FIG. 5A where locating holes 22 may be formed in the terminal support 11 prior to or subsequently to cutting the assembly. It is to be appreciated that the presence of the ground leads 42 between the adjacent coplanar transmission lines 44 as viewed in the direction of the array of ground leads 42 and signal leads 43 sufficiently reduces interference between the adjacent coplanar transmission lines 44. If there is any possibility of interference occurring between the coplanar transmission lines 44 as viewed in the direction of vertical stacking of the coplanar transmission lines 44 in FIG. 5A, coplanar transmission lines 44 may be spaced alternately with two consecutive dielectric layers 45 having a grounding conductor layer 47 interposed therebetween, as fragmentarily shown in FIG. 5C.

Alternatively, microstrip transmission lines may be used as termination high frequency transmission line 13. The method of manufacturing a terminal support 11 in that instance will be described with reference to FIG. 6. Like the instance in which termination high frequency transmission line 13 are constituted by coplanar transmission lines, a ground layer 48 comprising a conductor layer is formed on a dielectric substrate 41 as by vapor deposition of copper or gold. Then, a dielectric layer 49 is formed on the ground layer 48 by vapor deposition of $SiO_2$, for example, and on that dielectric layer 49 are formed a plurality of parallel, spaced signal transmission lines 51 to constitute microstrip transmission lines 52, on which another dielectric layer 53 is formed. The steps of forming a ground layer 48, a dielectric layer 49, signal transmission lines 51, and a dielectric layer 53 successively are repeated until a desired build-up assembly of ground layers, microstrip transmission lines and dielectric layers is obtained. Subsequently, this build-up assembly may be cut in thicknesses D1 transversely of the length of the signal transmission lines 44 to obtain a plurality of terminal supports 11 having microstrip transmission lines 52 as termination high frequency transmission lines 13.

Figure 6:
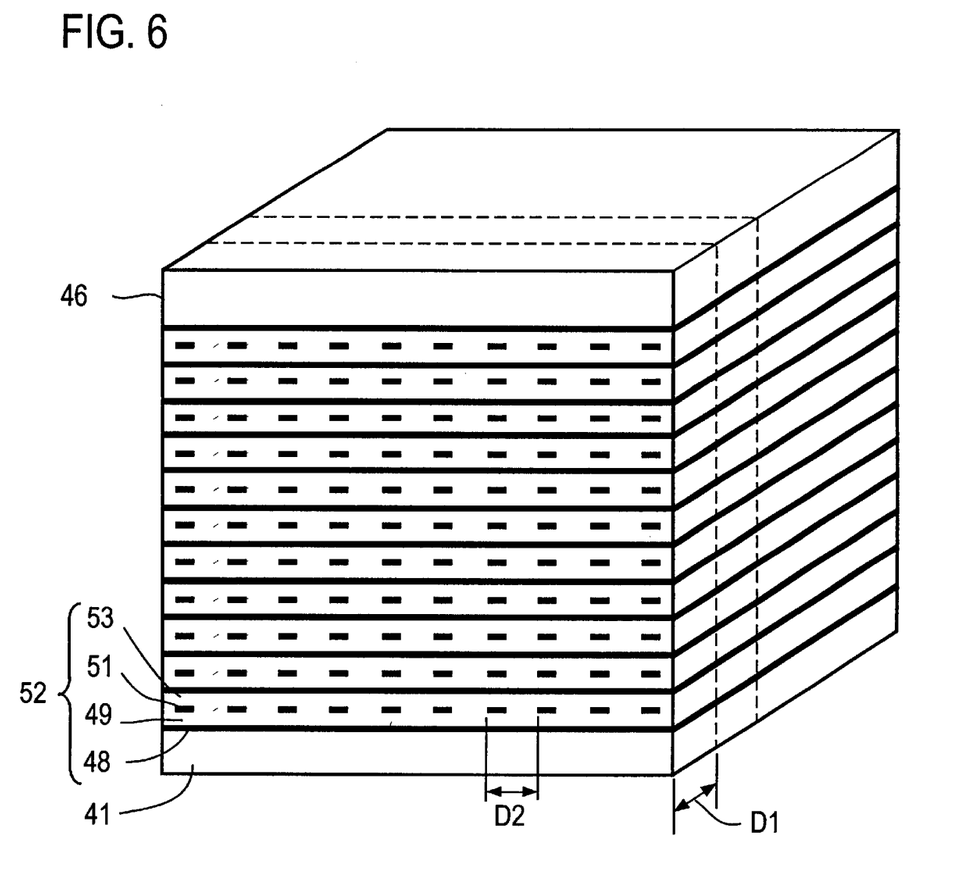
FIG. 6 is a perspective view illustrating the step in the process for making a terminal support 11 having microstrip transmission lines.

In alternative embodiments, polyimide film may be used to form the dielectric layer in FIGS. 5 and 6, to which a conductor foil such as copper foil is applied. Then, the conductor foil may be processed to form coplanar transmission line 44 or signal transmission lines 51, or may be made a ground layer without processing. Such coplanar transmission lines or signal transmission lines and ground layers are then stacked one on another and heat welded together to prepare a build-up assembly as shown in FIG. 5A or FIG. 6.

Figure 7:
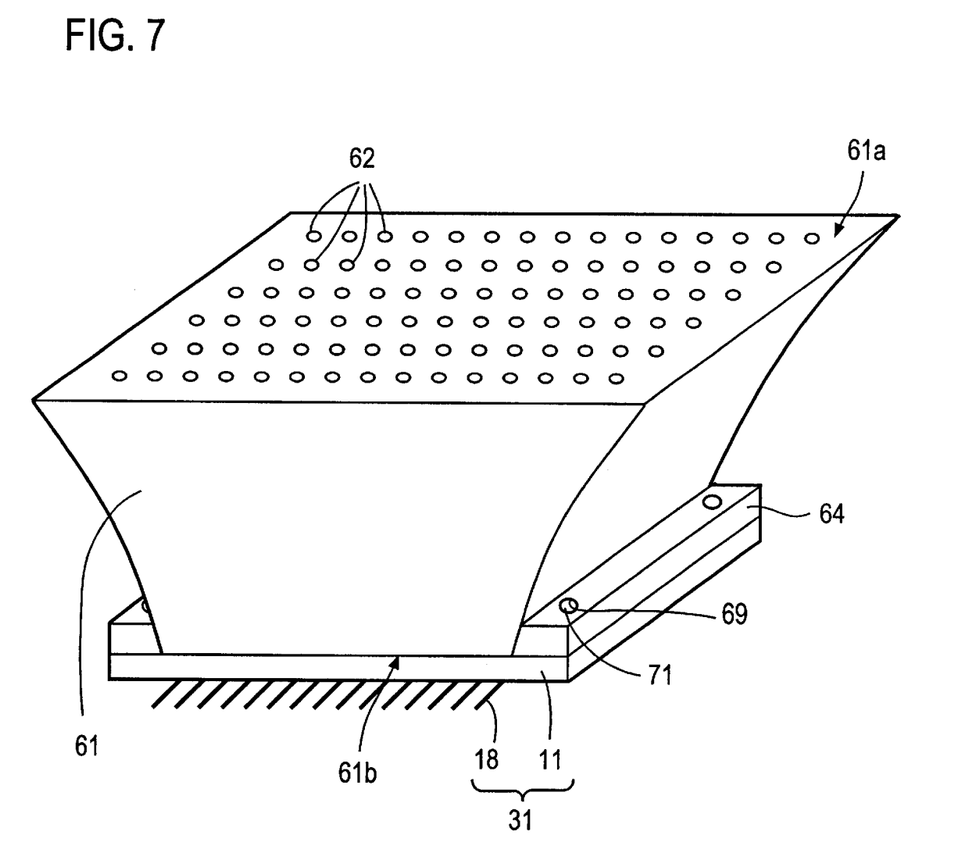
FIG. 7 is a perspective view illustrating an embodiment of this invention in which a transmission line block 61 is combined with a integrated microcontact pin device 31.

In order to facilitate the connection between the integrated microcontact pin device described above and a performance board as well as to maintain the satisfactory high frequency characteristics, it is desirable to detachably attach a transmission line block to the terminal support 11. Specifically as shown in FIG. 7, for example, a transmission line block 61 is detachably attached to the side of the integrated microcontact pin device 31 opposite from the contact pins 18 which are distributed in a two-dimensional array.

The transmission line block 61 has disposed therein high frequency transmission lines 62 for relay one ends of which are connected to the corresponding termination high frequency transmission lines 13 of the integrated microcontact pin device 31 and the other ends of which lie on the end face 61a of the block 61 opposite from the integrated microcontact pin device 31. The high frequency transmission lines 62 for relay are arranged such that the spacings between the adjacent lines increase gradually as the lines extend away from the integrated microcontact pin device 31 until the spacings between the adjacent relay high frequency transmission lines 62 at the end face 61a of the block 61 become about 10 times as large as those at the opposite end face adjoining the terminal support 11, while the characteristic impedances are maintained uniform over all of the transmission lines 62. In addition, the relay high frequency transmission lines 62 are capable of transmitting DC signals as well, and are adapted to match with the termination high frequency transmission lines 13 in the characteristic impedance.

Figure 8A:
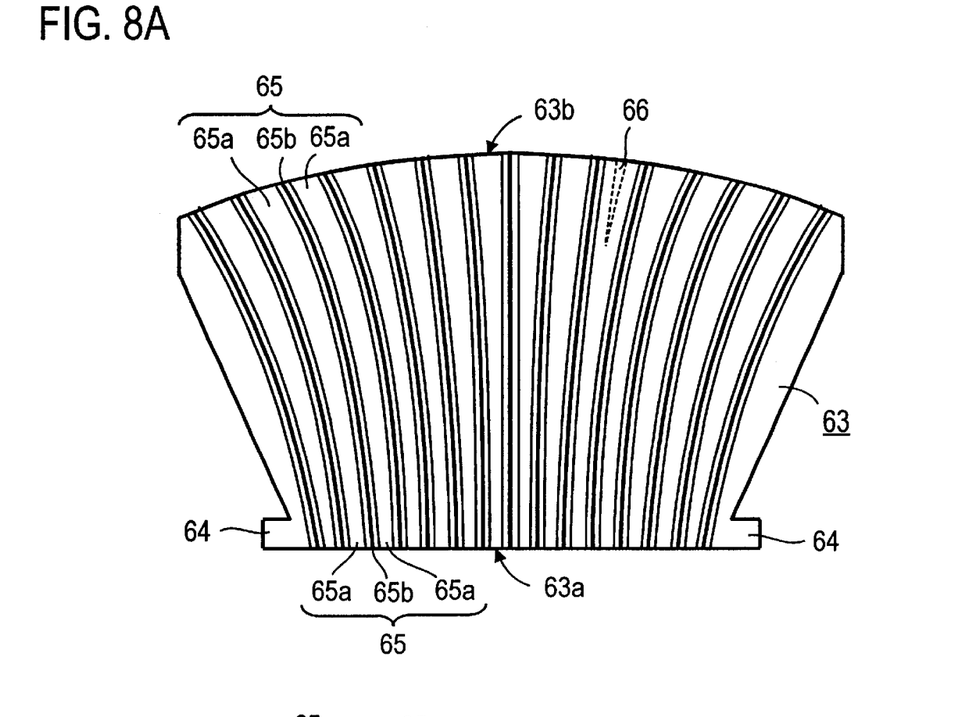
FIGS. 8A–8D are illustrations showing the steps of making a transmission line block 61 having coplanar transmission lines.

Next, the method of manufacturing a transmission line block 61 will be described. In one example, as shown in FIG. 8A, a thin dielectric substrate 63 of ceramics, for example having one shorter side and the opposite longer side is first prepared. The substrate 63 has integral mounting tabs 64 formed as extensions from the opposite sides of the shorter side 63a. A multiplicity of coplanar transmission lines 65 having one ends lying on the shorter side 63a and the other ends lying on the longer side 63b are formed of metal such as copper, gold or the like on one side surface of the substrate 63 as by photoetching or thick-film printing process. Specifically, wide ground leads 65a and narrow signal leads 65b are alternately arranged such that each one of the signal leads 65b and two ground leads 65a adjacent thereto on its opposite sides cooperate to form a coplanar transmission line 65.

The number of the coplanar transmission lines 65 is made equal to that of the contact pins 18 of the integrated microcontact pin device 31 along the column (or row) direction of the pin array and the pitch of the transmission lines on the shorter side 63a is made equal to that of the contact pins 18 along the column (or row) direction. The spacings of the coplanar transmission lines 65 at the other ends, that is, at the ends on the longer side 63b are the largest, say about 10 times as large as those on the shorter side 63a (although not shown to scale in the drawings for the convenience of drawing). In that case, the width of the signal leads 65b is made constant while at the same time the spacings between each one of the signal leads 65b and two ground leads 65a on the opposite sides are also made constant in order to ensure that the characteristic impedance of the coplanar transmission lines 65 is maintained substantially constant. Consequently, each of the ground leads 65a is broadened in width gradually as it extends from the shorter side 63a towards the longer side 63b. If desired, however, as representatively shown in broken lines at one location in FIG. 8A, each ground lead 65a may be provided with a slit 66 which starts at some midpoint between the opposite ends of the ground lead and broadens width-wise as it comes closer to the longer side 63b so as to maintain the width of the ground lead 65a effectively constant. In addition, whereas the shorter side 63a is made straight, the longer side 63b is made an arcuate curve which is concave with respect to the shorter side 63a so as to make all the coplanar transmission lines 65 equal in path length, hence in the signal propagation time.

Figure 8B:
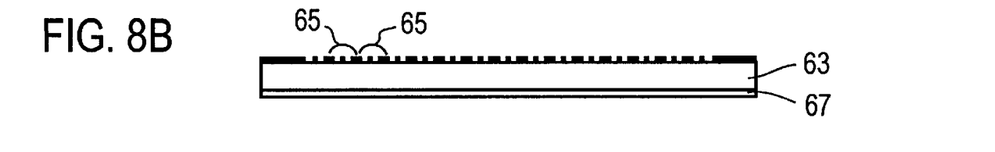
Figure 8C:
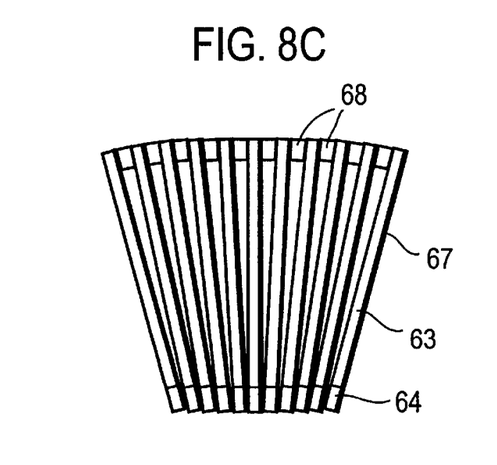
Figure 8D:
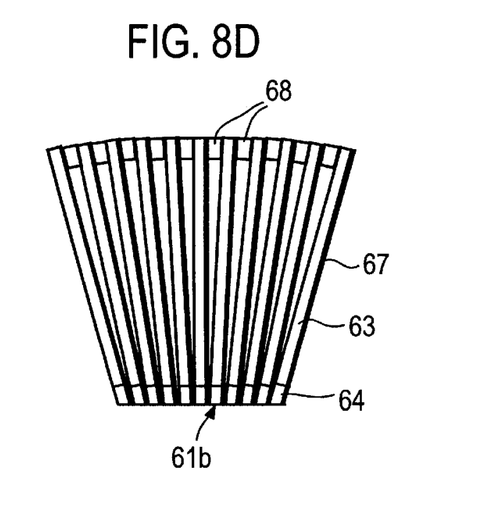

As required, a layer 67 of conductor such as copper is formed on the other side surface of the substrate 63 by vapor deposition, for example as shown in FIG. 8B. Then, a multiplicity of the thus obtained substrate 63 having many coplanar transmission lines 65 formed thereon are successively stacked one after another and bonded together with their shorter sides 63a in contact with each other and with the longer sides 63b abutting against each other with spacers 68 of ceramics or glass, for example interposed between the adjacent longer sides, as shown in FIG. 8C. The bonding may be effected by the use of organic adhesives such as epoxy-based or polyimide-based adhesive. Or when spacers 68 having a low dielectric constant such as ceramics or glass are interposed, the bonding may be effected by heat and pressure. Then, the end faces of the built-up substrates 63 on the side where they have been directly (without spacers) bonded together are flattened as shown in FIG. 8D to complete a transmission line block 61.

The number of the substrates 63 to be stacked is made equal to that of the contact pins 18 of the integrated microcontact pin device 31 along the row (or column) direction of the pin array and the pitch of the coplanar transmission lines 65 on the flattened end face 61b along the direction of stacking of the substrates 63 is made equal to that of the contact pins 18 along the row (or column) of the pin array. In other words, the thickness of the individual substrates 63 is preselected such that this requirement is met.

Figure 9:
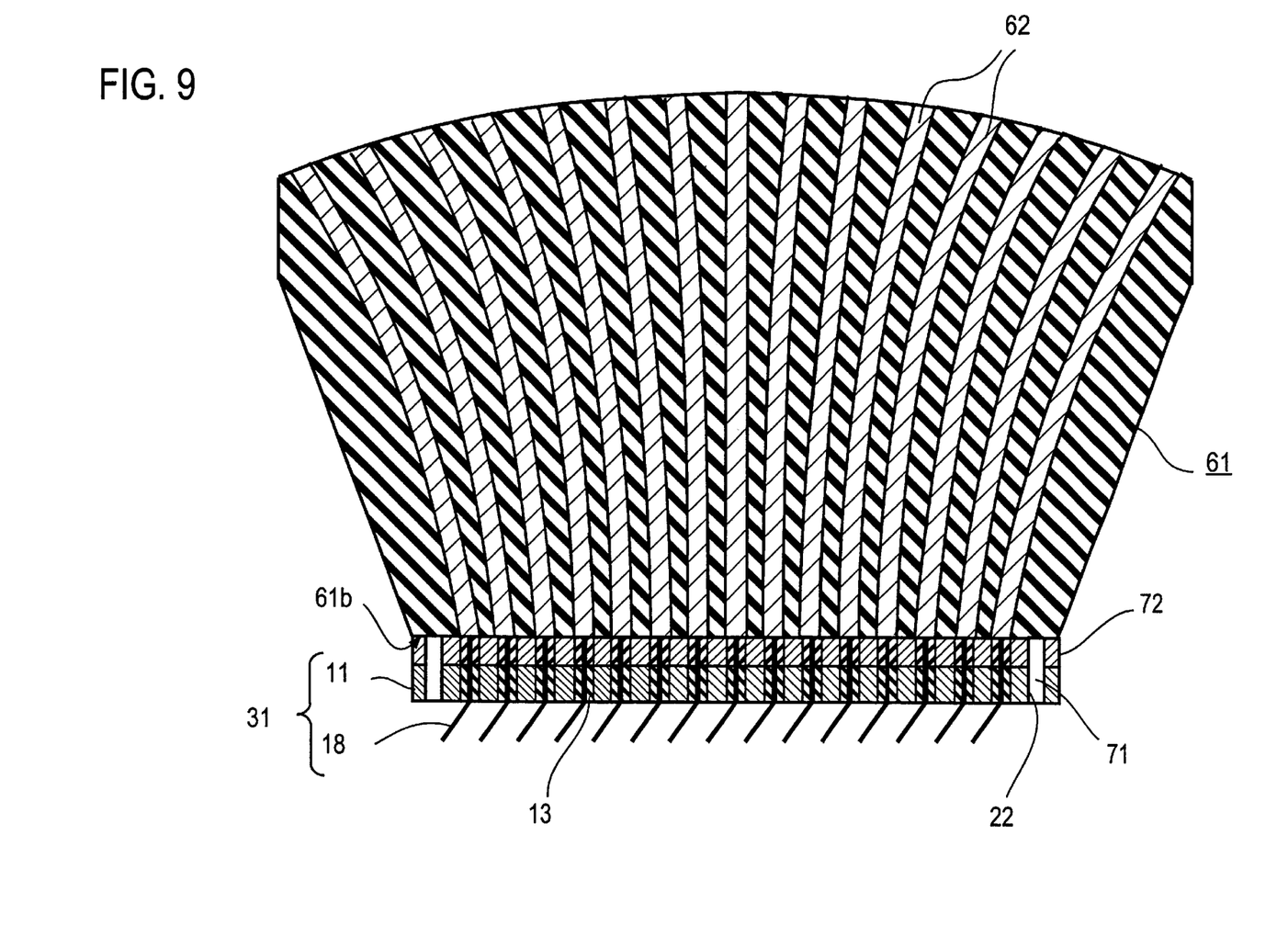
FIG. 9 is a cross-sectional view illustrating another embodiment of this invention in which a transmission line block 61 is combined with a integrated microcontact pin device 31.
Figure 10A:
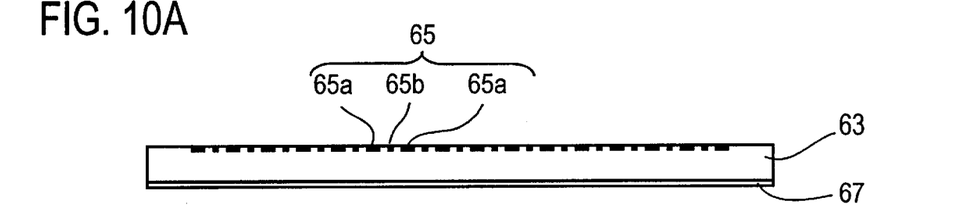
FIGS. 10A–10D are illustrations showing the steps of making another form of the transmission line block 61.

The thus constructed transmission line block 61 is superposed on the terminal support 11, and locating pins 71 are passed through the locating holes 69 formed through the mounting tabs 64 of each of the stacked substrates 63 on the opposite sides thereof and the aligned locating holes 22 (FIG. 1) of the terminal support 11 to align the transmission line block 61 and the terminal support 11 with each other, as shown in FIG. 7 so as to insure that the termination high frequency transmission lines 13 of the terminal support 11 and the corresponding relay high frequency transmission lines 62 of the block 61 are brought into contact and connection with each other. In an alternative embodiment, as shown in FIG. 9, a connector plate 72 similar in construction to the terminal support 11 may be preliminarily secured to the connection end face 61b of the transmission line block 61 for connection with the integrated microcontact pin device 31. The connector plate 72 has locating pins 71 fixed thereto and extending therefrom. To this connector plate 72 the terminal support 11 is detachably attached with the locating pins 71 passed through the locating holes 22 of the terminal support 11 to align and connect the associated high frequency transmission lines with each other. It will be appreciated that this arrangement facilitates the replacement of the integrated microcontact pin device 31. As an alternative method for producing coplanar transmission lines 65 as relay high frequency transmission line 62, as shown in FIG. 10A, ground lead forming grooves and signal lead forming grooves may be formed on a substrate 63 in a pattern similar to that shown in FIG. 8A and a metal layer is formed over the surface of the substrate 63 in which the grooves are formed, followed by flattening and grinding that surface to provide alternating ground leads 65a and signal leads 65b in the groves. The subsequent processing may be carried out in the same manner as described before in connection with FIG. 8.

Figure 10B:
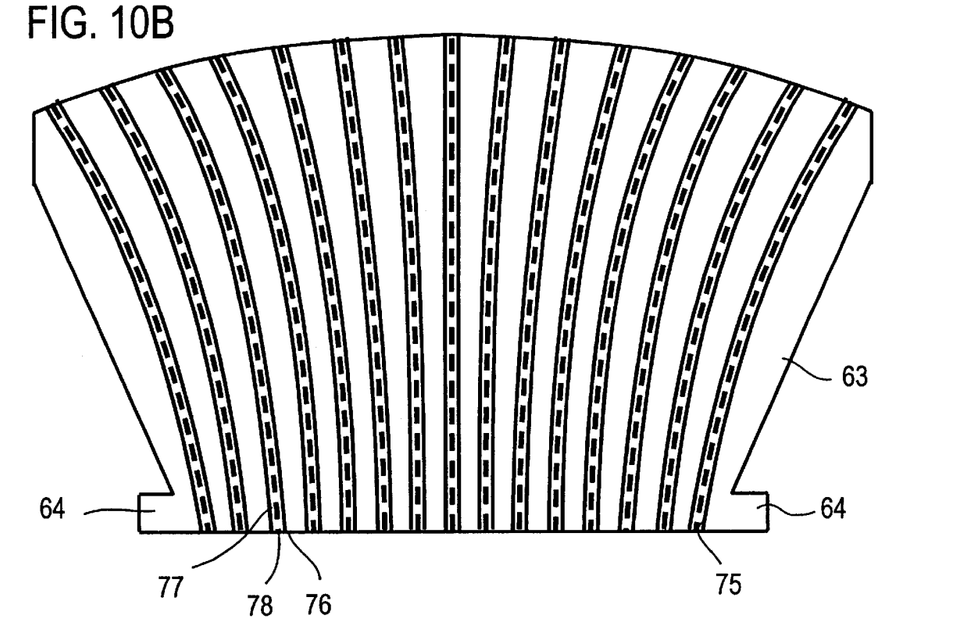
Figure 10C:
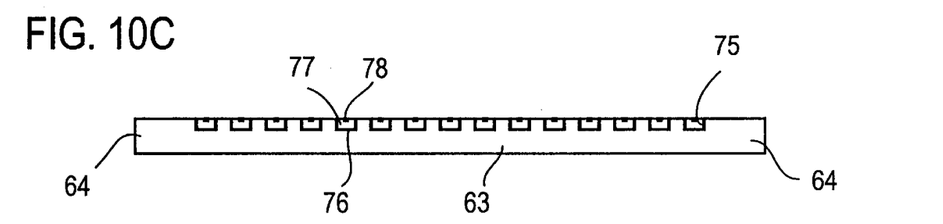
Figure 10D:
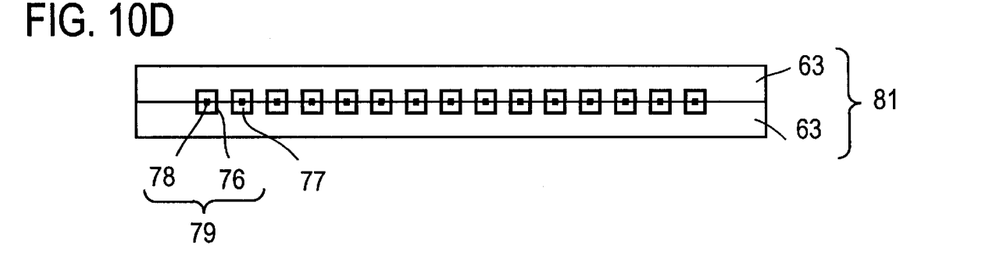

Next, an instance where the relay high frequency transmission lines 62 comprise coaxial transmission lines will be described. As shown in FIGS. 10B and 10C, a multiplicity of rectangular grooves 75 each corresponding in shape to one half of the cross-section of a square coaxial transmission line are formed in one side surface of a substrate 63 in a pattern in which the spacings between the adjacent grooves gradually broaden, the inner surfaces of the grooves 75 are metallized with gold or copper to form outer conductors 76, followed by filling the grooves 75 with dielectric material 77 such as $SiO_2$ by vapor deposition. Then, a central conductor 78 is formed on the dielectric material 77 in each of the grooves 75 along the central axis thereof as by printing or photoetching process. In FIG. 10B the central conductors 78 are shown in broken lines for easy viewing. A multiplicity of the thus constructed substrates 63 having longitudinally split rectangular coaxial transmission line halves formed thereon are prepared, and the substrates 63 are joined together in pairs with their surfaces having the grooves 75 formed therein bonded with each other as shown in FIG. 10D such that each pair of the longitudinally split rectangular halves of a square transmission line are mated together to form a square coaxial transmission line. This completes a mated assembly 81 of the substrates 63 having a multiplicity of square coaxial transmission lines 79 which are spaced apart more widely at one ends and more closely at the other ends. A multiplicity of the thus mated substrate assemblies 81 are stacked one on another with their one ends in contact with each other and the other ends are stacked one after another and bonded together with their one ends in contact with each other and with the other ends abutting against each other with spacers interposed therebetween, like the manner shown in FIG. 8C. Then, the end faces of the built-up substrates 81 on the side where they have been directly (without spacers) bonded together are flattened like the manner shown in FIG. 8D to complete a transmission line block 61. It will be understood that round coaxial transmission lines may be constructed in the manner similar to that described above in connection with the coaxial transmission line square in cross-section.

In another alternative embodiment, the relay high frequency transmission line 62 may likewise be constructed by a microstrip transmission line. In this instance, although not shown, it will be readily appreciated that it may only be required that signal leads be formed on one side surface of a substrate 63 in a pattern similar to that of the coplanar transmission lines 65 shown in FIG. 8A and that a conductor layer 67 be formed as a ground face on the other side surface of the substrates 63.

Figure 11:
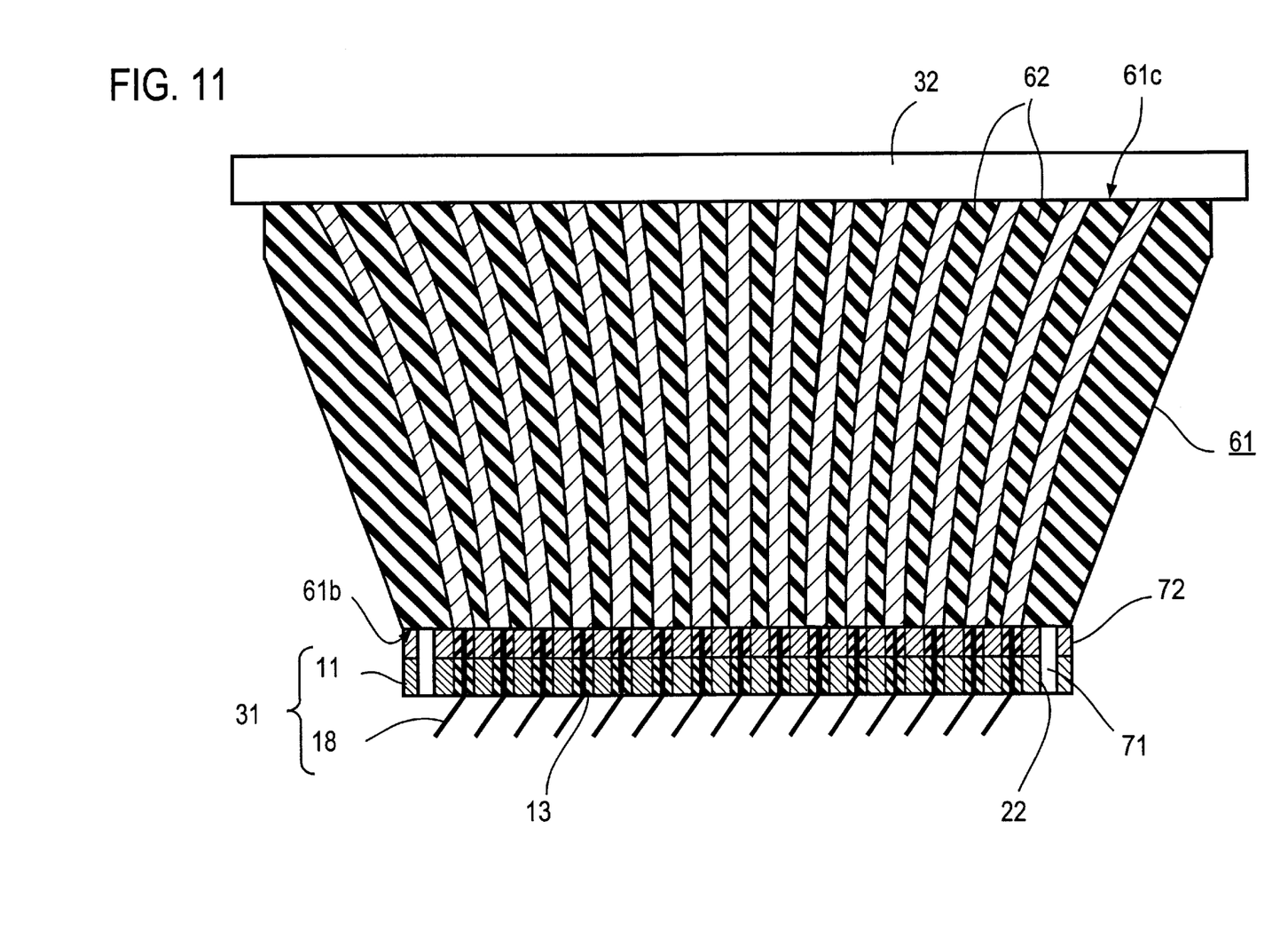
FIG. 11 is a cross-sectional view illustrating yet another embodiment of this invention in which a transmission line block is combined with a integrated microcontact pin device.

The widely spaced apart ends of the relay high frequency transmission lines 62 are connected to the corresponding terminals (electrodes) of a performance board on the side of the transmission line block 61 opposite from the integrated microcontact pin device 31. In order to facilitate the connection, as shown in FIG. 11, the end face 61c of the transmission line block 61 opposite from the integrated microcontact pin device 31 may be ground flat to become parallel to the end face 61a of the transmission line block 61 on the side of the integrated microcontact pin device 31 prior to bringing the performance board 32 into opposing contact with the flattened end face 61a so that the relay high frequency transmission lines 62 are connected to the associated electrodes. In this case, differences in signal propagation time between the relay high frequency transmission lines 62 due to the differences in path length may be compensated for by inserting delay lines in the performance board 32 to make the overall signal propagation time equal.

While the integrated microcontact pin device 31 is illustrated as having contact pins 18 arranged in a two-dimensional array in the embodiments described above, it should be understood that they may be arranged in a one-dimensional array. The associated transmission line block 61 may be one having the relay high frequency transmission lines 62 arrange in a two-dimensional array as shown in FIGS. 8A, 10A and 10D. Moreover, while the contact pins 18 are illustrated as being obliquely attached, they may be oriented so as to contact the pads (electrodes) of a semiconductor integrated circuit to be tested perpendicularly thereto.

As additional options, (a) The transmission line block 61 may be ultrasonically vibrated in micromotions to cause the microcontact pins 18 to scratch the electrodes 36 of a semiconductor integrated circuit being tested to destroy any oxide film thereon for the purpose of reducing the contact resistance between the electrodes 36 and the contact pins 18.

(b) Cooling mechanism may be provided for dissipating any heat which may be conducted from the electrodes 36 of a semiconductor integrated circuit being tested to the transmission line block 61 through the microcontact pins 18 or by radiation.

(c) A monitor camera may be installed on a side of the transmission line block 61 or at any other appropriate location to identify a marker on the substrate of a semiconductor integrated circuit being tested, and a guide mechanism may be provided to insure that the microcontact pins 18 are guided to the electrodes 36 of a semiconductor integrated circuit being tested.

As will be appreciated from the foregoing descriptions, this invention offers the following advantages:

(1) The invention makes it possible to realize microcontact pins which allow for effectively testing the operation of semiconductor integrated circuits prior to being packaged or the state-of-the-art packaged microminiature semiconductor integrated circuits. It is possible to realize microcontact pins having a pin pitch on the order of 150 $\mu$m as well as a pin count as many as several thousand channels.

(2) It allows for probing of high velocity signals, since the characteristic impedance of the signal transmission lines are maintained constant until just before they reach the contact pins 18 for probing the electrodes 36 of a semiconductor integrated circuit being tested.

(3) It allows for not only the transmission of test signals and measurement signals, but also the application of DC bias to a semiconductor integrated circuit to be tested.

(4) It is also possible to integrate microcontact pins 18 in a substrate in a two-dimensional array in correspondence with the electrode array of a semiconductor integrated circuit to be tested.

(5) In the instance in which the terminal support 11 of the integrated microcontact pin device 31 is provided with guide grooves or guide pins, the entire integrated microcontact pin device 31 may be easily replaced and yet easily adjusted for alignment either when the type of the semiconductor integrated circuit to be tested is changed or when the microcontact pins 18 wear out.

(6) In the case in which the transmission line block 61 is used, the spacings between the termination high frequency transmission lines 13 of the integrated microcontact pin device 31 may be broadened two-dimensionally or three-dimensionally to facilitate the connection with a performance board.

(7) In the embodiment in which the contact pins 18 are obliquely attached, each time the contact pins 18 are brought into contact with the electrodes of a semiconductor integrated circuit, the contact pins are resiliently flexed, resulting in displacing the points of contact whereby contact pins scrape the electrodes to destroy the oxide films on the electrodes to thereby establish better electrical contact.

(8) In the case in which coaxial transmission lines or coplanar transmission lines are employed as termination high frequency transmission lines 13 and relay high frequency transmission line 62, it is possible to prevent interference between the adjacent transmission lines.

What is claimed is:

1. An integrated microcontact pin device comprising:

a terminal support having a plurality of termination high frequency transmission lines capable of transmitting direct current formed therethrough;

a plurality of contact pins connected at one ends to one ends of the corresponding termination high frequency transmission lines on one side surface of said terminal support; and a transmission line block detachably attached to said terminal support on the other side surface of the support, said transmission line block having relay high frequency transmission lines connected at one ends to the other ends of the corresponding termination high frequency transmission lines on the other side surface of said terminal support, the spacings between the relay high frequency transmission lines at their other ends being broadened to be larger than the spacings between said termination high frequency transmission lines.

2. The integrated microcontact pin device of claim 1 wherein said terminal support is in the form of a plate, said termination high frequency transmission lines are two-dimensionally distributed, and said transmission line block is of a three-dimensionally gradually broadening configuration.

3. The integrated microcontact pin device of claim 2 wherein said transmission line block is a three-dimensional block comprising a plurality of laminar blocks stacked one on another, each of said laminar blocks having said relay high frequency transmission lines arranged in a two-dimensional array.

4. The integrated microcontact pin device of claim 2 wherein the relay high frequency transmission lines of said transmission line block are shielded from each other in terms of high frequency.

5. The integrated microcontact pin device of claim 2 wherein said contact pins extend obliquely in generally the same direction with respect to said one side surface of said terminal support.

6. The integrated microcontact pin device of claim 2 wherein said termination high frequency transmission lines of said terminal support are shielded from each other in terms of high frequency.

7. The integrated microcontact pin device of claim 2 wherein said terminal support and said transmission line block are provided with locating means for aligning with each other.

8. The integrated microcontact pin device of claim 2 wherein said relay high frequency transmission lines are equal in length of electrical path.

9. An integrated microcontact pin device comprising:

a terminal support substrate;

a plurality of feed-throughs each of which extends through the thickness of the substrate and forms a termination high frequency transmission line capable of transmitting both direct current and radio frequency (RF) current and has a first end protruding from an under side of said terminal support substrate and a second end protruding from an upper side of said terminal support substrate;

a plurality of contact pins each connected at one end to the first end of one of said termination high frequency transmission lines on an under side of said terminal support substrate; and a transmission line block detachably attached to said terminal support substrate on an upper side surface of the terminal support substrate, said transmission line block having relay high frequency transmission lines each connected at one end to the second end of one of said termination high frequency transmission lines on the upper side surface of said terminal support substrate, the spacings between the relay high frequency transmission lines at their other ends broadened to be larger than the spacings between said termination high frequency transmission lines.

10. The integrated microcontact pin device of claim 9 wherein said terminal support substrate is in the form of a plate, said termination high frequency transmission lines are two-dimensionally distributed, and said transmission line block is a three-dimensional gradually broadening configuration.

* * * * *